United States Patent
Ahn et al.

(10) Patent No.: US 9,318,679 B2
(45) Date of Patent: Apr. 19, 2016

(54) OPTICAL DEVICE AND METHOD FOR MANUFACTURING SAME

(71) Applicant: POINT ENGINEERING CO., LTD., Asan-si (KR)

(72) Inventors: Bum Mo Ahn, Suwon-si (KR); Seung Ho Park, Hwaseong-si (KR); Tae Hwan Song, Cheonan-si (KR)

(73) Assignee: Point Engineering Co., Ltd., Asan-si (KR)

( * ) Notice: Subject to any disclaimer, the term of this patent is extended or adjusted under 35 U.S.C. 154(b) by 0 days.

(21) Appl. No.: 14/765,457

(22) PCT Filed: Feb. 6, 2014

(86) PCT No.: PCT/KR2014/001009
§ 371 (c)(1),
(2) Date: Aug. 3, 2015

(87) PCT Pub. No.: WO2014/123365
PCT Pub. Date: Aug. 14, 2014

(65) Prior Publication Data
US 2015/0372209 A1    Dec. 24, 2015

(30) Foreign Application Priority Data

Feb. 7, 2013    (KR) .................. 10-2013-0013818

(51) Int. Cl.
*H01L 33/54* (2010.01)
*H01L 33/62* (2010.01)

(52) U.S. Cl.
CPC ............... *H01L 33/62* (2013.01); *H01L 33/54* (2013.01); *H01L 2224/48091* (2013.01)

(58) Field of Classification Search
None
See application file for complete search history.

(56) References Cited

U.S. PATENT DOCUMENTS

2008/0217637 A1*  9/2008  Kim ................ H01L 33/505
                                         257/98

FOREIGN PATENT DOCUMENTS

| KR | 10-2011-0036728 | 4/2011 | ............ H01L 33/62 |
| KR | 10-2012-0010083 | 2/2012 | ............ H01L 33/48 |
| KR | 10-2012-0056992 | 5/2012 | ............ H01L 33/48 |
| KR | 10-2012-0104734 | 9/2012 | ............ H01L 33/52 |

OTHER PUBLICATIONS

International Searching Authority, International Search Report—International Application No. PCT/KR2014/001009, dated May 12, 2014, 2 pages.

* cited by examiner

*Primary Examiner* — Daniel Shook
(74) *Attorney, Agent, or Firm* — Sunstein Kann Murphy & Timbers LLP (57) ABSTRACT

An optical device includes a metal substrate wherein at least one vertical insulation layer is formed from the upper to the lower surface; a metal plated layer formed on the upper surface of the metal substrate except for the vertical insulation layer; and an optical device chip bonded to one portion of the metal plated layer. One electrode of the optical device chip is electrically connected to a bonded surface of the metal plated layer, and the other electrode of the optical device chip is wire bonded to the other portion of metal plated layer. The optical device chip and a peripheral region thereof is shielded with a sealant, and at least one groove is formed on a partial surface of the metal plated layer so that a portion of the sealant is directly bonded to the metal substrate.

10 Claims, 5 Drawing Sheets

Fig. 1

<Prior Art>

Fig. 2

<Prior Art>

OPTICAL DEVICE AND METHOD FOR MANUFACTURING SAME

TECHNICAL FIELD

The present invention relates to an optical device, more particularly to an optical device for enhancing the adhesive strength between the sealant material and the metal substrate and a method for manufacturing same.

BACKGROUND ART

Semiconductor light emitting diode (LED), which is one of the optical devices, is receiving attention from various fields as an environment friendly light source. Recently, as applications of LEDs are expanding to various fields such as interior and exterior illuminations, automobile headlights, and backlight units (BLU) of the display devices, there are needs for high optical efficiency and excellent heat radiation characteristics of the LEDs. For high efficiency LEDs, materials or structures of the LEDs should be improved primarily, however, also there is a need for the improvement of the structures of the LED packages, the materials used therein, and the like.

Figure 1:
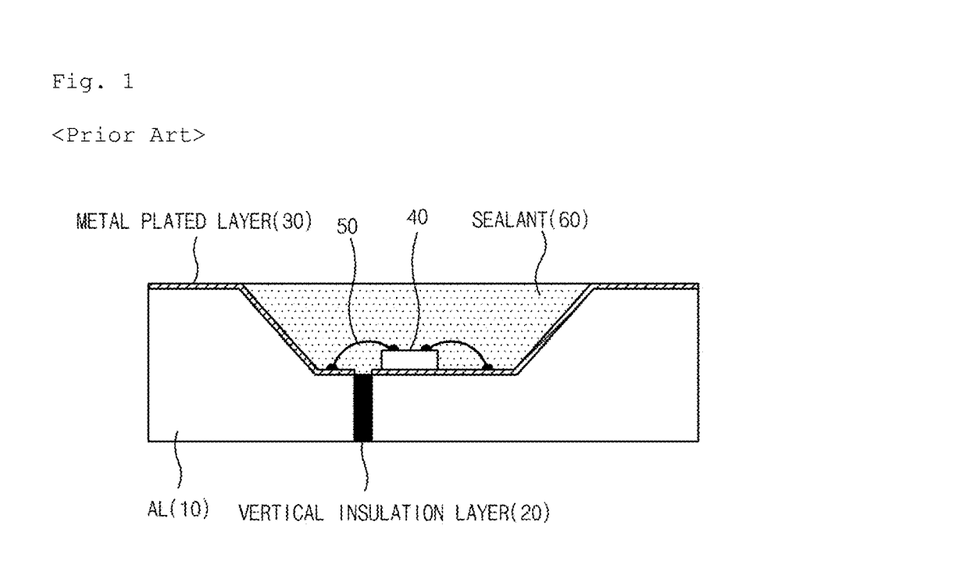
FIGS. 1 and 2 are the exemplary drawings illustrating the cross-sectional structures of the general cavity type optical devices.
Figure 2:
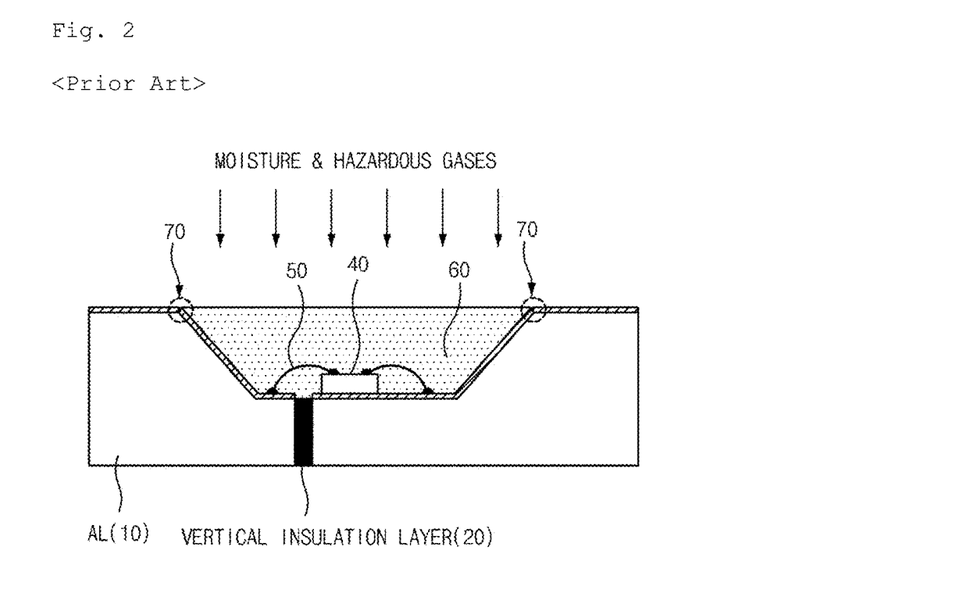

FIGS. 1 and 2 are the exemplary illustrations of the cross-sectional structures of the general cavity type optical devices.

According to a manufacturing process referring to FIG. 1, first, a cavity is formed in the aluminum metal substrate 10 wherein a vertical insulation layer 20 is formed. And the cavity is comprised of a groove having a downwardly narrowing taper with a predetermined depth starting from the upper surface of the metal substrate and directing towards the lower surface thereof. In order to enhance the reflection capability or the bonding capability of the light generated from the optical device chip 40, a metal plated layer such as a silver plated layer 30 is formed on the upper surface, except the upper surface of the vertical insulation layer, of the aluminum metal substrate 10 wherein a cavity is formed.

Then, an optical device chip 40 is bonded to the one portion of the bottom surface of the cavity where a metal plated layer 30 is formed, wherein said one portion of the bottom surface is located in other side than the other portion of the bottom surface with respect to the vertical insulation layer 20. And the electrode of the optical device chip 40 is wire bonded to the bottom surface onto which the optical device chip 40 is bonded, and also to the other portion of the bottom surface located in other side than said one portion of the bottom surface with respect to the vertical insulation layer 20. And then a silicon sealant 60 is injected into the cavity for hermetic sealing.

The silicon sealant 60 extends the lifetime of the optical device chip 40 and the wire 50 by protecting them from the external factors. That is, the silicon sealant 60 is adhered to the metal (Ag) plated layer 30 inside the cavity and blocks infiltration of the external moisture, humid, hazardous gases, and the like. For reference, when the electrode of the optical device chip 40 is exposed at the bottom of the chip, it may be directly soldered to the bottom surface on which the chip is to be bonded without wire bonding of the corresponding electrode.

In a general cavity type optical device having a foresaid structure, the luminous efficiency and the lifetime of the optical device chip 40 are degraded since the metal (Ag) plated layer 30 is discolored due to the degradation of the adhesive strength between the silicon sealant 60 and the metal (Ag) plated layer 30. The reason is that since the surface roughness of the metal (Ag) plated layer 30 where the silicon sealant 60 is adhered to is very smooth, so the adhesive strength between the silicon sealant 60 and the metal (Ag) plated layer 30 become relatively weaker. In order to solve such a problem, a method may be used wherein the surface of the metal (Ag) is plasma treated for a higher roughness, and the surface energy of the metal (Ag) is increased so that the surface thereof is converted into a hydrophile surface. However, such method may not be an efficient improvement measure since it requires process equipments and high processing cost.

Figure 3:
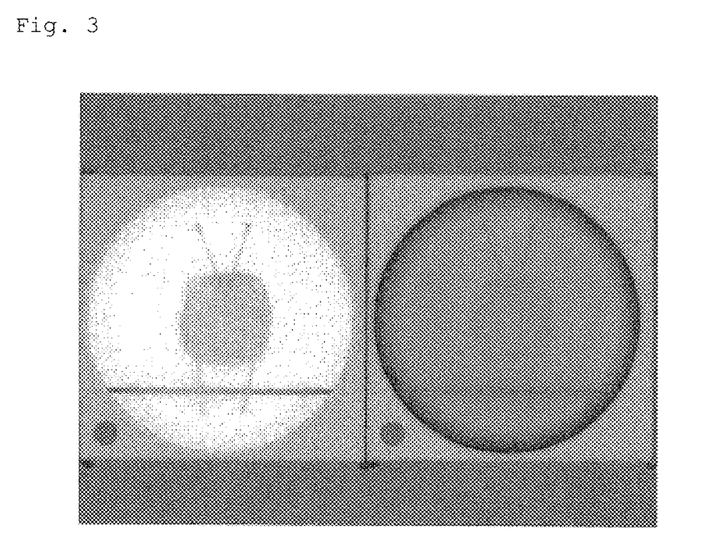
FIG. 3 is an exemplary drawing illustrating the result of the corrosion test of the optical devices having the structures illustrated in FIGS. 1 and 2.

FIG. 3 is an exemplary drawing illustrating the results of corrosion test of an optical device having a structure illustrated in FIGS. 1 and 2. In order to test the adhesive strength between the silicon sealant 60 and the metal (Ag) plated layer 30, a test was performed wherein an ink was dropped on a spot where the upper end of the inclined surface of the cavity and the edge 70 of the upper horizontal surface of the aluminum metal substrate 10 meet, as illustrated in FIG. 2. The test result shows that moisture and hazardous gas infiltrate along the main wall of the cavity near the edge 70 due to the weak adhesive strength between the metal plated layer 30 and the silicon sealant 60 near the edge 70. As a result, it was found that a portion of the surface of the metal (Ag) plated layer 30 which is formed on the inclined surface inside the cavity is getting discolored due to the infiltrating moisture and hazardous gases as illustrated on the right side of FIG. 3. Consequently, such effect of discoloration will degrade the reflection capability of the light. Moreover, it may result in the shortening of the lifetime of the optical device chip 40 due to the infiltrated hazardous gases or moisture. For reference, the left side of FIG. 3 illustrates the plane view of the cavity prior to the test, and the right side illustrates the plane view of the cavity under test. When referring to FIG. 3, it is found that the discoloration near the edge 70 is more severe.

SUMMARY OF INVENTION

Technical Problem

For solving above described problems, an objective of the present invention is to provide an optical device and a method for manufacturing same, wherein not only the optical reflection capability is consistently maintained, but also the factors which may shorten the lifetime or cause failure of the optical device can be fundamentally eliminated by suggesting a structure which can enhance the adhesive strength between the sealant and the metal substrate or between the sealant and the metal plated layer which is formed on the upper surface of the metal substrate.

Further, another objective of the present invention is to provide an optical device and a method for manufacturing same, wherein the infiltration of hazardous substances into the sealant is fundamentally eliminated by sealing the sealant which protects the optical device chip adhered on the top of the metal substrate from moisture and hazardous gases, and by sealing the adhesion surface of the sealant.

Solution to Problem

To achieve above described objective, an optical device according to an exemplary embodiment of the present invention includes:

a metal substrate wherein at least one vertical insulation layer is formed from an upper surface of the metal substrate towards a downward direction;

a metal plated layer formed on the upper surface of the metal substrate except for the vertical insulation layer; and an optical device chip bonded to one portion of the metal plated layer, wherein one electrode of the optical device chip is electrically connected to a bonded surface of the metal plated layer, and the other electrode of the optical device chip is wire bonded to the other portion of metal plated layer wherein said one portion of the metal plated layer is located in one side and the other portion of the metal plated layer is located in the other side with respect to the vertical insulation layer, wherein the optical device chip and a peripheral region thereof is shielded with a sealant, and at least one groove is formed on a partial surface of the metal plated layer so that a portion of the sealant is directly bonded to the metal substrate.

It is characterized in that the groove penetrates the metal plated layer from a top surface thereof towards the downward direction to have a predetermined depth in the metal substrate below the metal plated layer, wherein the groove is machined into a circular shape surrounding the optical device chip and divided into two sides by the vertical insulation layer.

In some cases, it is also characterized in that each groove penetrates the metal plated layer from the top surface thereof towards the downward direction to have a predetermined depth in the metal substrate below the metal plated layer, wherein each groove is machined into a rectangular shape or a square shape surrounding the optical device chip and spaced apart with a predetermined distance.

An optical device according to another exemplary embodiment of the present invention includes:

a metal substrate wherein at least one vertical insulation layer is formed from an upper surface of the metal substrate towards a downward direction, and at least one downwardly narrowing cavity is formed from the upper surface of the metal substrate down to a predetermined depth so that the vertical insulation layer is exposed at a bottom surface of the cavity;

a metal plated layer formed on the upper surface of the metal substrate except for the vertical insulation layer; and an optical device chip bonded to one portion of the metal plated layer at the bottom surface of the cavity, wherein one electrode of the optical device chip is electrically connected to a bonded surface of the metal plated layer, and the other electrode of the optical device chip is wire bonded to the other portion of metal plated layer wherein said one portion of the metal plated layer is located in one side and the other portion of the metal plated layer is located in the other side with respect to the vertical insulation layer at the bottom surface of the cavity, wherein an inside of the cavity is shielded with a sealant, and the metal plated layer is partially removed at an upper end of an inclined surface of a main wall of the cavity so that a portion of the sealant is directly bonded to the metal substrate at the upper end of the inclined surface of the main wall of the cavity.

In such an optical device, it is also characterized in that the metal plated layer is partially removed at the upper end of the inclined surface of the main wall of the cavity by forming a step portion at the metal substrate by machining along an edge where the upper end of the inclined surface of the main wall of the cavity and the upper surface of the metal substrate meet.

Meanwhile, a method for manufacturing an optical device according to an exemplary embodiment of the present invention includes:

preparing a metal substrate where a vertical insulation layer is formed;

forming a metal plated layer on an upper surface of the metal substrate except for the vertical insulation layer;

forming at least one groove to expose the metal substrate at both portions of the metal plated layer located in left and right sides with respect to the vertical insulation layer, respectively;

bonding an optical device chip to one portion of the metal plated layer in a manner that one electrode of the optical device chip is electrically connected to a bonded surface of the metal plated layer through wire bonding or soldering while the other electrode of the optical device chip is wire bonded to the other portion of the metal plated layer wherein said one portion of the metal plated layer is located in one side and the other portion of the metal plated layer is located in the other side with respect to the vertical insulation layer; and shielding the optical device chip and a peripheral region thereof with a sealant so that at least the groove is filled with the sealant inserted thereto.

It is characterized in that the groove penetrates the metal plated layer from a top surface thereof towards a downward direction to have a predetermined depth in the metal substrate below the metal plated layer, and the groove is machined into a circular shape surrounding the optical device chip.

In some cases, it is also characterized in that each groove penetrates the metal plated layer from a top surface thereof towards a downward direction to have a predetermined depth in the metal substrate below the metal plated layer, wherein each groove is machined into a rectangular shape or a square shape surrounding the optical device chip and spaced apart with a predetermined distance.

Advantageous Effects of Invention

As described above, an optical device and a method for manufacturing same according to an exemplary embodiment of the present invention can obtain a more superior sealing power by suggesting a structure and a method wherein a portion of the sealant to be bonded to the metal plated layer is directly bonded to the metal substrate, in other words, by directly bonding the sealant to the aluminum metal substrate having a more superior bonding strength than the metal plated layer at the edge or the peripheral region thereof where the sealant is bonded to the metal plated layer. Accordingly, the present invention minimizes the infiltration of moisture or hazardous gases into the shielding sealant therefore it may bring the effect that the optical reflection property can be consistently maintained by preventing discoloration of the metal plated layer caused by the hazardous gases and the like.

In addition, the present invention may also bring the effect that the lifetime of an optical device may be extended by blocking the infiltration of hazardous substances into the sealant by tightly sealing the optical device through direct bonding of the aluminum metal substrate with the sealant.

DETAILED DESCRIPTION OF EMBODIMENT

Hereinafter, an optical device and a method for manufacturing same according to an exemplary embodiment of the present invention will be described in detail with reference to the accompanying drawings.

Figure 4:
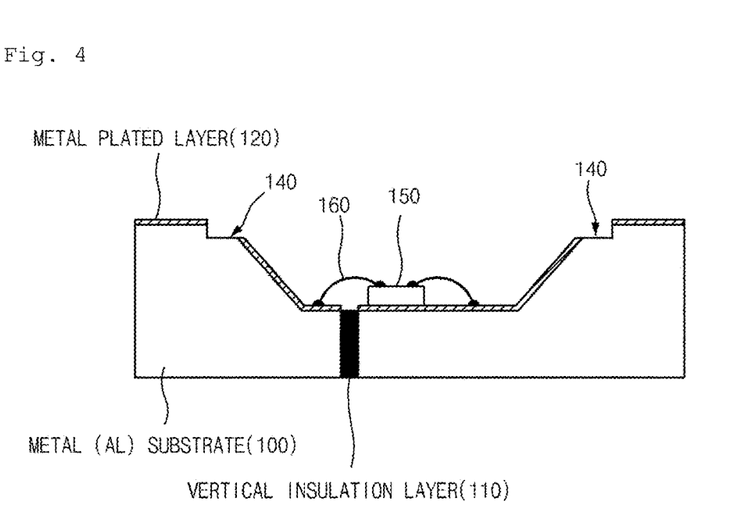
FIGS. 4 and 5 are the exemplary drawings illustrating the cross-sections of the optical devices according to an exemplary embodiment of the present invention.
Figure 5:
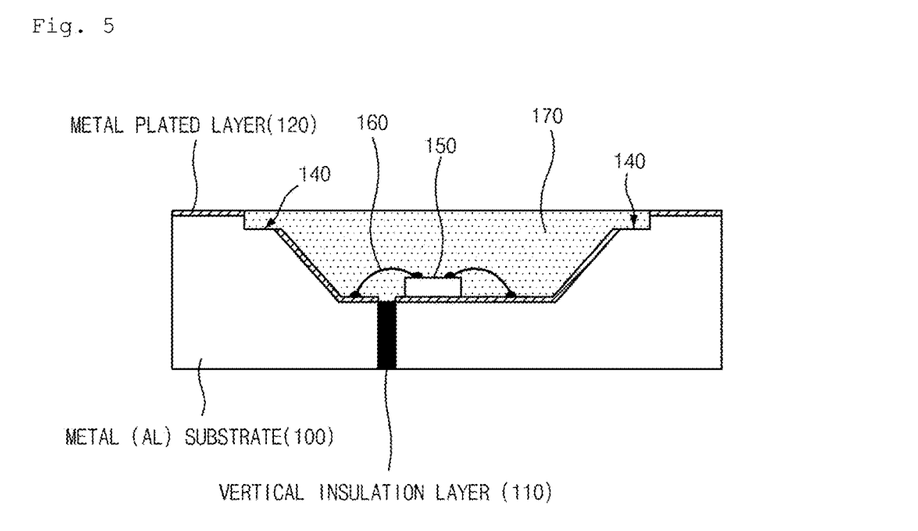

FIGS. 4 and 5 are the exemplary drawings illustrating the cross-sections of the optical devices according to an exemplary embodiment of the present invention. Hereinafter, a structure of an optical device along with a method for manufacturing same will be described.

Referring to FIG. 4, firstly, an aluminum (Al) metal substrate 100 wherein a vertical insulation layer 110 is prepared for manufacturing of a cavity type optical device according to an exemplary embodiment of the present invention. Foresaid aluminum (Al) metal substrate 100 is a metal substrate having superior heat transfer characteristics and may also be made of an aluminum alloy. Description about the forming method of a vertical insulation layer 110 penetrating the metal substrate 100 from the upper surface thereof to the lower surface thereof and being formed along the vertical direction will be omitted hereinafter since it is described in detail in the registered patent titled "High heat-radiant optical device substrate and manufacturing method thereof" which had been filed by the present applicants through the earlier patent application.

Once the metal substrate 100 is prepared, a cavity is formed using a cutting machine from the upper surface of the metal substrate 100 down to a predetermined depth as illustrated in FIG. 4, wherein at least one downwardly narrowing cavity is formed so that one vertical insulation layer 110 is exposed in the bottom surface of the cavity. A plurality of cavities may be formed suitable for the size or the usage of the metal substrate 100.

When the formation of the cavity is completed, a metal (Ag) plated layer 120 is formed on the upper surface of the metal substrate 100 except for the vertical insulation layer 110. The metal (Ag) plated layer 120 not only increases the optical efficiency by increasing the reflectance of the light generated in the optical device, but also enhances the adhesiveness by enhancing the bonding strength with the conductive wire 160 in the wire bonding process which will be processed later. Metals to be used may be formed at least any one from silver, gold, nickel, copper, and palladium. A publicly known electroplating method or an electroless plating method may be used as a method for forming a metal plated layer.

When the metal (Ag) plated layer 120 is formed, a portion of the metal (Ag) plated layer 120 of the upper end of the inclined surface of the main wall of the cavity is removed so that the sealant 170 being inserted into the cavity and filling the inside thereof is directly bonded to the metal substrate 140 at the upper end (70 in FIG. 2) of the inclined surface of the main wall of the cavity. In a method for partial removing, a portion of the metal plated layer is removed using a cutting machine by forming a step portion 140 at the edge (70 in FIG. 2) where the upper end of the inclined surface of the main wall of the cavity and the upper surface of the metal substrate 100 meet as illustrated in FIG. 4, then the metal plated layer 120 located near the upper end (70 in FIG. 2) of the inclined surface of the main wall of the cavity is also removed. The reason for forming a step portion 140 in the metal substrate 100 of the upper end of the inclined surface of the main wall of the cavity in such a way is that the sealing effect of the sealant 170 is increased by allowing direct bonding of the sealant 170, which will be described later, with the aluminum (Al) metal substrate 100.

When a portion of the metal plated layer 120 is removed using the foresaid process, an optical device chip 150 is bonded to one portion of the metal plated layer 120 at the bottom surface of the cavity. Herein, one electrode of the optical device chip 150 is electrically connected to a bonded surface of the metal plated layer 120 through a wire 160 or soldering while the other electrode is connected through a wire 160 to the other portion of the metal plated layer 120 wherein said one portion of the metal plated layer 120 is located in one side and the other portion of the metal plated layer 120 is located in the other side with respect to the vertical insulation layer 110. The detailed description about the foresaid optical device bonding and the wire bonding processes will be omitted since those are also the publicly known technologies.

When the bonding of the optical device and the wire bonding is completed, the inside of the cavity is shielded with a silicon sealant 170 as illustrated in FIG. 5 so that at least the sealant 170 is bonded to the exposed portion of the metal substrate 100 at the upper end (70 in FIG. 2) of the inclined surface of the main wall of the cavity. In this way, the silicon sealant 170 is bonded to the bottom inside the cavity and the metal (Ag) plated layer 120 of the inclined surface of the main wall of the cavity to have a certain degree of adhesive strength. In the upper end (70 in FIG. 2) of the inclined surface of the main wall of the cavity, the sealant is directly bonded to the surface of the aluminum metal substrate 100 whereat a step portion 140 is formed. Therefore, the infiltration of moisture or hazardous gases from the outside can be blocked due to a more superior adhesive strength between the sealant and the aluminum metal substrate 100 than that between the sealant and the metal plated layer 120.

Although it is described about a cavity type optical device in the above exemplary embodiment, the present invention may be applied to a flat type optical device without any particular modification.

Figure 6:
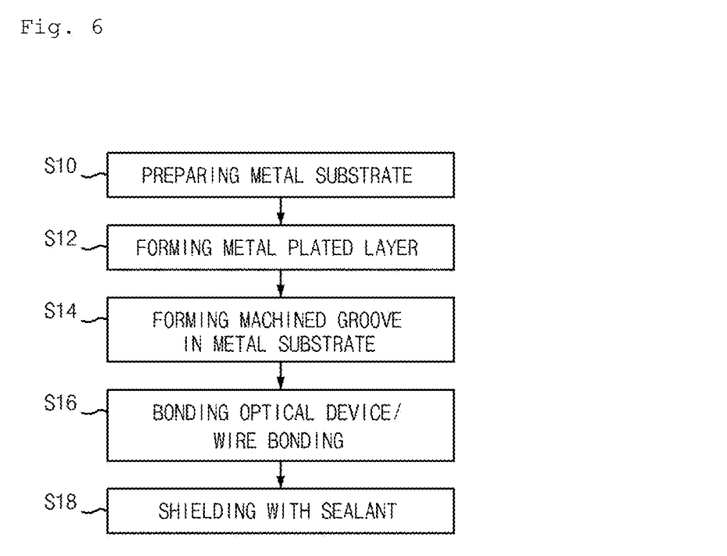
FIG. 6 is an exemplary drawing illustrating a manufacturing process flow diagram according to an exemplary embodiment of the present invention.
Figure 7:
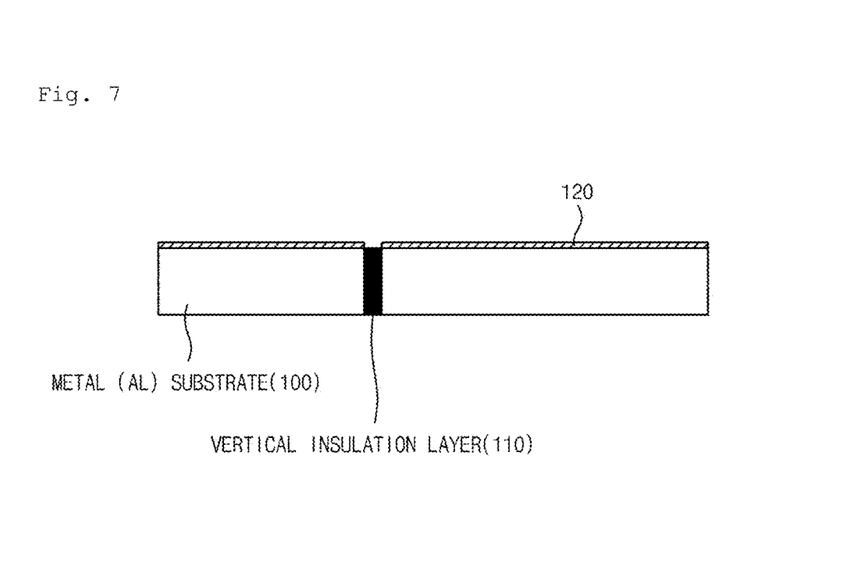
FIGS. 7 and 8 are the exemplary drawings illustrating the cross-sections of the optical devices according to another exemplary embodiment of the present invention.
Figure 8:
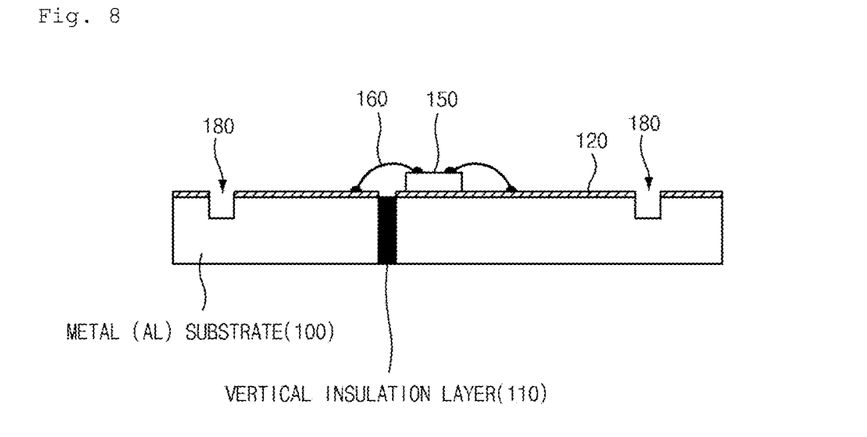
Figure 9:
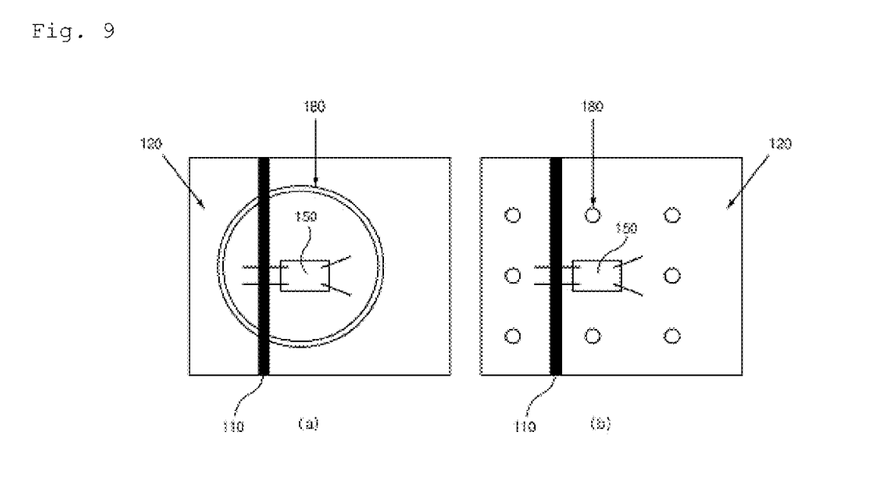
FIG. 9 is an exemplary drawing illustrating a plan view of the optical devices illustrated in FIGS. 7 and 8.
Figure 10:
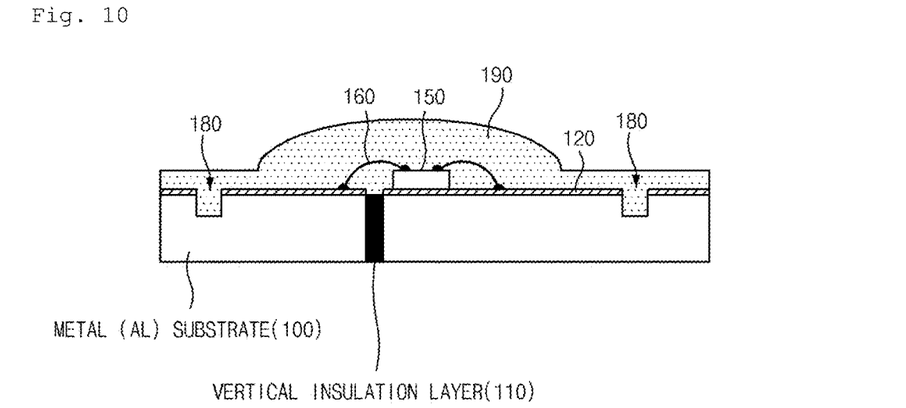
FIG. 10 is an exemplary drawing illustrating the cross-section of an optical device manufactured according to FIG. 6.

FIG. 6 is an exemplary drawing illustrating a manufacturing process flow diagram according to an exemplary embodiment of the present invention; FIGS. 7 and 8 are the exemplary drawings illustrating the cross-sections of the optical devices according to another exemplary embodiment of the present invention; FIG. 9 is an exemplary drawing illustrating a plan view of the optical devices illustrated in FIGS. 7 and 8; and FIG. 10 is an exemplary drawing illustrating the cross-section of an optical device manufactured according to FIG. 6.

Referring to FIG. 6, in order to manufacture a flat type optical device, firstly, in step S10, an aluminum (Al) metal substrate 100, where a vertical insulation layer 110 penetrating the aluminum (Al) metal substrate 100 from the upper surface thereof to the lower surface thereof is formed as illustrated in FIG. 7, is prepared. Later, in step S12, a metal (Ag) plated layer 120 is formed on the upper surface of the metal substrate 100 except for the vertical insulation layer 110. Types of metals which can be used for the metal (Ag) plated layer 120 are same as the previously described ones, and the forming method thereof is same as the previously described method.

When the metal (Ag) plated layer 120 is formed, later in step S14, as illustrated in FIG. 8, at least one groove 180 is formed so that the metal substrate 110 is exposed at some portion of the metal plated layer 120 wherein said some portions are located in the right and left sides of the vertical insulation layer 110, respectively. Foresaid groove 180 is comprised of a groove having a predetermined depth which penetrates the metal plated layer 120 from the upper surface thereof to the lower surface thereof as illustrated in FIG. 8, and the groove may also be formed in a circular shape surrounding the optical device chip 150 as illustrated in FIG. 9(a). As a modified exemplary embodiment, each of the grooves 180 penetrates the metal plated layer 120 from the top surface thereof towards the downward direction to have a predetermined depth in the metal substrate 100 below, wherein each of the grooves 180 may be machined into a rectangular shape or a square shape surrounding the optical device chip 150 and spaced apart with a predetermined distance as illustrated in FIG. 9(b).

After the grooves 180 penetrating the metal plated layer 120 and having a predetermined depth in the metal substrate 100 are formed in such a way, in step S16, an optical device chip 150 is bonded to one portion of the metal plated layer 120. Herein, one electrode of the optical device chip 150 is electrically connected to the bonded portion of the metal plated layer 120 through a wire 160 or soldering while the other electrode is connected through a wire 160 to the other portion of the metal plated layer 120 wherein said one portion of the metal plated layer 120 is located in one side and the other portion of the metal plated layer 120 is located in the other side with respect to the vertical insulation layer 110.

Later, in step S18, an optical device chip 150 and the peripheral region thereof are shielded with a sealant 190 so that at least the grooves 180 are sufficiently filled with the sealant 190 inserted thereto as illustrated in FIG. 10. At this time, it is preferred that the grooves 180 in the metal substrate 100 are located outside of the dome of the sealant 190 which shields the optical device chip 150 and the peripheral region thereof in a dome-like shape as illustrated in FIG. 10.

In this manner, in a flat-type optical device where an optical device chip is bonded to the metal substrate 100 having a vertical insulation layer 110, grooves 180 are formed such that a portion of the metal substrate 100 is exposed at the edge or the peripheral region thereof where the sealant 190 is bonded to the metal plated layer 120 prior to filling of the sealant 190 therein. Thus, the sealant 190 and the aluminum metal substrate 100 can be directly bonded together. Thus the present invention prevent infiltration of external moisture or hazardous gases due to the superior adhesive strength than that provided by a common structure wherein the metal plated layer 120 and the sealant 190 are simply bonded together.

Heretofore, although the present invention is explained with reference to the exemplary embodiments illustrated in the drawings, however, these are merely exemplary examples therefore a person of skilled in the art will understand that various modifications and other equivalent embodiments are possible from these examples. Thus, true technical protection range of the present invention must be determined as defined in the appended claims and their equivalents.

DESCRIPTION OF SYMBOLS

10: metal (Al) substrate
20: vertical insulation layer
30: metal (Ag) plated layer
40: optical device chip
50: wire
60: sealant (Si)
100: metal (Al) substrate
110: vertical insulation layer
120: metal (Ag) plated layer
140: step portion
160: wire
180: groove

The invention claimed is:

1. An optical device comprising:
a metal substrate wherein at least one vertical insulation layer is formed from an upper surface of the metal substrate towards a downward direction;
a metal plated layer formed on the upper surface of the metal substrate except for the vertical insulation layer; and
an optical device chip bonded to one portion of the metal plated layer, wherein one electrode of the optical device chip is electrically connected to a bonded surface of the metal plated layer, and the other electrode of the optical device chip is wire bonded to the other portion of metal plated layer wherein said one portion of the metal plated layer is located in one side and the other portion of the metal plated layer is located in the other side with respect to the vertical insulation layer,
wherein the optical device chip and a peripheral region thereof is shielded with a sealant, and at least one groove is formed on a partial surface of the metal plated layer so that a portion of the sealant is directly bonded to the metal substrate.

2. The optical device according to claim 1, wherein the groove penetrates the metal plated layer from a top surface thereof towards the downward direction to have a predetermined depth in the metal substrate below the metal plated layer, wherein the groove is machined into a circular shape surrounding the optical device chip and divided into two sides by the vertical insulation layer.

3. The optical device according to claim 1, wherein each groove penetrates the metal plated layer from the top surface thereof towards the downward direction to have a predetermined depth in the metal substrate below the metal plated layer, wherein each groove is machined into a rectangular shape or a square shape surrounding the optical device chip and spaced apart with a predetermined distance.

4. An optical device comprising:
a metal substrate wherein at least one vertical insulation layer is formed from an upper surface of the metal substrate towards a downward direction, and at least one downwardly narrowing cavity is formed from the upper surface of the metal substrate down to a predetermined depth so that the vertical insulation layer is exposed at a bottom surface of the cavity;
a metal plated layer formed on the upper surface of the metal substrate except for the vertical insulation layer; and
an optical device chip bonded to one portion of the metal plated layer at the bottom surface of the cavity, wherein one electrode of the optical device chip is electrically connected to a bonded surface of the metal plated layer, and the other electrode of the optical device chip is wire bonded to the other portion of metal plated layer wherein said one portion of the metal plated layer is located in one side and the other portion of the metal plated layer is located in the other side with respect to the vertical insulation layer at the bottom surface of the cavity,
wherein an inside of the cavity is shielded with a sealant, and the metal plated layer is partially removed at an upper end of an inclined surface of a main wall of the cavity so that a portion of the sealant is directly bonded to the metal substrate at the upper end of the inclined surface of the main wall of the cavity.

5. The optical device according to claim 4, wherein the metal plated layer is partially removed at the upper end of the inclined surface of the main wall of the cavity by forming a step portion at the metal substrate by machining along an edge where the upper end of the inclined surface of the main wall of the cavity and the upper surface of the metal substrate meet.

6. A method for manufacturing an optical device, comprising:
   preparing a metal substrate where a vertical insulation layer is formed;
   forming a metal plated layer on an upper surface of the metal substrate except for the vertical insulation layer;
   forming at least one groove to expose the metal substrate at both portions of the metal plated layer located in left and right sides with respect to the vertical insulation layer, respectively;
   bonding an optical device chip to one portion of the metal plated layer in a manner that one electrode of the optical device chip is electrically connected to a bonded surface of the metal plated layer through wire bonding or soldering while the other electrode of the optical device chip is wire bonded to the other portion of the metal plated layer wherein said one portion of the metal plated layer is located in one side and the other portion of the metal plated layer is located in the other side with respect to the vertical insulation layer; and
   shielding the optical device chip and a peripheral region thereof with a sealant so that at least the groove is filled with the sealant inserted thereto.

7. The method for manufacturing an optical device according to claim 6, wherein the groove penetrates the metal plated layer from a top surface thereof towards a downward direction to have a predetermined depth in the metal substrate below the metal plated layer, and the groove is machined into a circular shape surrounding the optical device chip.

8. The method for manufacturing an optical device according to claim 6, wherein each groove penetrates the metal plated layer from a top surface thereof towards a downward direction to have a predetermined depth in the metal substrate below the metal plated layer, wherein each groove is machined into a rectangular shape or a square shape surrounding the optical device chip and spaced apart with a predetermined distance.

9. A method for manufacturing an optical device comprising:
   preparing a metal substrate where a vertical insulation layer is formed;
   forming at least one downwardly narrowing cavity from an upper surface of the metal substrate down to a predetermined depth so that the vertical insulation layer is exposed at a bottom surface of the cavity;
   forming a metal plated layer on the upper surface of the metal substrate except for the vertical insulation layer;
   partially removing the metal plated layer at an upper end of an inclined surface of a main wall of the cavity so that the sealant inserted in the cavity and filling an inside of the cavity is directly bonded to the metal substrate at the upper end of the inclined surface of the main wall of the cavity;
   bonding an optical device chip to one portion of the metal plated layer in a manner that one electrode of the optical device chip is electrically connected to a bonded surface of the metal plated layer through wire bonding or soldering while the other electrode of the optical device chip is wire bonded to the other portion of the metal plated layer wherein said one portion of the metal plated layer is located in one side and the other portion of the metal plated layer is located in the other side with respect to the vertical insulation layer; and
   shielding the inside of the cavity with a sealant so that the sealant is bonded to at least an exposed portion of the metal substrate at the upper end of the inclined surface of the main wall of the cavity.

10. The method for manufacturing an optical device according to claim 9, wherein the metal plated layer is partially removed by forming a step portion at the metal substrate by machining along an edge where the upper end of the inclined surface of the main wall of the cavity and the upper surface of the metal substrate meet in the step of partially removing the metal plated layer at an upper end of an inclined surface of a main wall of the cavity.

* * * * *